United States Patent [19]
Babcock et al.

[11] 3,993,411
[45] Nov. 23, 1976

[54] BONDS BETWEEN METAL AND A NON-METALLIC SUBSTRATE

[75] Inventors: Guy L. Babcock, North Syracuse; Walter M. Bryant, Liverpool; Constantine A. Neugebauer; James F. Burgess, both of Schenectady, all of N.Y.

[73] Assignee: General Electric Company, Schenectady, N.Y.

[22] Filed: Feb. 12, 1975

[21] Appl. No.: 549,440

Related U.S. Application Data

[60] Continuation of Ser. No. 366,043, June 1, 1973, abandoned, which is a division of Ser. No. 245,889, April 20, 1972, Pat. No. 3,766,634.

[52] U.S. Cl. ............................ 403/271; 403/404; 52/759; 174/68.5; 228/903
[51] Int. Cl.² ........................................ C04B 37/02
[58] Field of Search .......... 403/270, 271, 272, 404; 228/121, 122, 123, 124, 195, 198, 903; 357/4; 52/759

[56] References Cited
UNITED STATES PATENTS

| | | | |
|---|---|---|---|
| 1,906,691 | 5/1933 | Lilienfeld | 357/4 X |
| 3,010,188 | 11/1961 | Bol et al. | 228/122 X |
| 3,128,545 | 4/1964 | Cooper | 228/121 |
| 3,220,938 | 11/1965 | McLean et al. | 357/4 X |
| 3,333,324 | 8/1967 | Roswell et al. | 29/589 UX |
| 3,517,432 | 6/1970 | Sandstrom | 228/121 |
| 3,676,292 | 7/1972 | Pryor et al. | 52/759 X |

FOREIGN PATENTS OR APPLICATIONS

| | | | |
|---|---|---|---|
| 761,045 | 11/1956 | United Kingdom | 228/122 |

Primary Examiner—Ronald J. Shore
Attorney, Agent, or Firm—Geoffrey H. Krauss; Joseph T. Cohen; Jerome C. Squillaro

[57] ABSTRACT

A direct bond between metallic members and non-metallic members is achieved at elevated temperatures in a controlled reactive atmosphere without resorting to the use of electroless plating, vacuum deposition or intermediate metals. A metal member such as copper, for example, is placed in contact with a non-metallic substrate, such as alumina, the metal member and the substrate are heated to a temperature slightly below the melting of the metal, e.g., between approximately 1065° and 1080° C. for copper, with the heating being performed in a reactive atmosphere, such as an oxidizing atmosphere, for a sufficient time to create a copper-copper oxide eutectic melt which, upon cooling, bonds the copper to the substrate. Various metals, non-metals and reactive gases are described for direct bonding.

6 Claims, 7 Drawing Figures

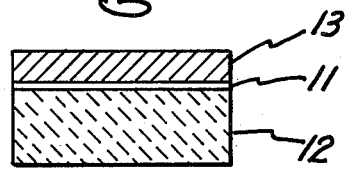
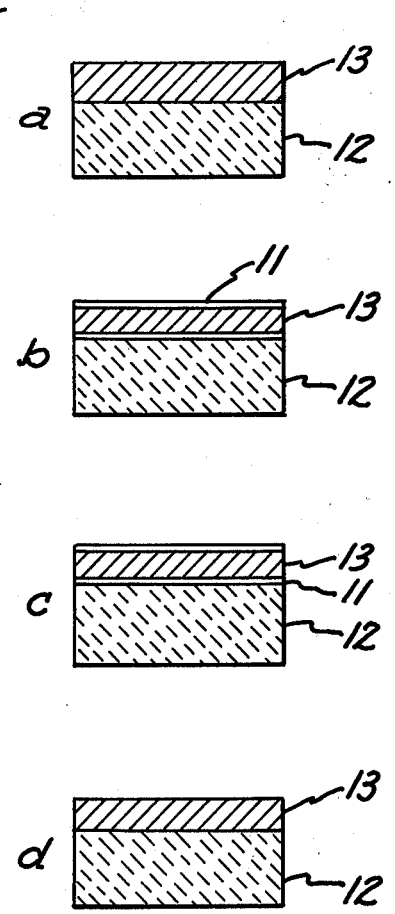
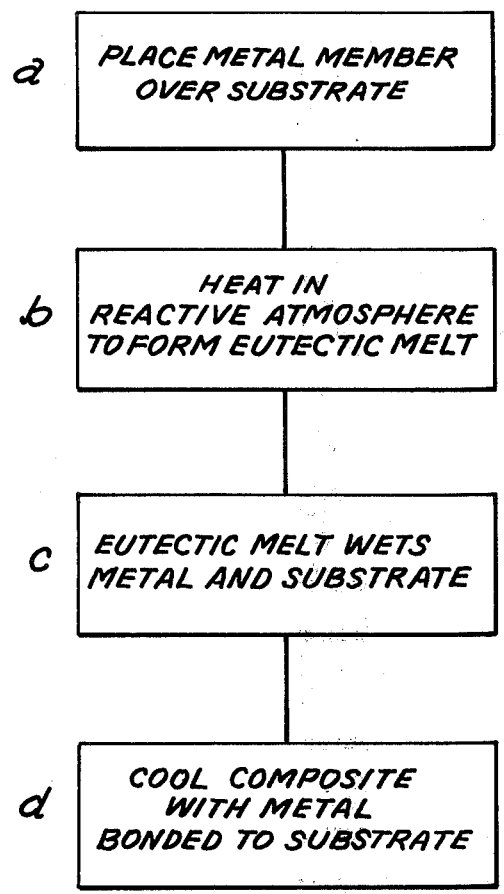

BONDS BETWEEN METAL AND A NON-METALLIC SUBSTRATE

This application is a continuation of application Ser. No. 366,043, filed June 1, 1973, now abandoned, which in turn is a division of application Ser. No. 245,889, filed Apr. 20, 1972, which latter application is now U.S. Pat. No. 3,766,634.

The present invention relates to improved bonds and methods of bonding together non-metallic members to metal members and non-metallic members to other non-metallic members. This application relates to concurrently filed application Ser. No. 245,890, now U.S. Pat. No. 3,744,120, issued July 10, 1973 of common assignee, the entire disclosure of which is incorporated herein by reference thereto.

Various methods of bonding non-metallic members together or to metallic members have been employed in an attempt to satisfactorily wet both members. One such method includes a mixture of titanium hydride and a solder metal, such as copper, silver or gold, applied to the member to be metallized or bonded and the hydride is disassociated by the application of heat in the presence of the solder metal. In this process, the heating is preferably done in a non-oxidizing atmosphere, such as pure dry hydrogen. The description found in U.S. Pat. No. 2,570,248 is typical of such a process.

Another method of bonding metals to ceramics is described by J. T. Klomp of Philips Research Laboratories. This method is described as employing low-oxygen affinity metals applied to a ceramic under high pressures, e.g., 1 Kg/cm$^2$. Where oxygen-affinity metals are employed, sufficiently high pressures are required "to destroy the oxide film so that metal-ceramic contact can be made." Hence, this method employs extremely high pressures to effect bonding. While these methods may produce desirable bonds for many applications, obviously the most desirable bond would be a direct bond between the copper and the ceramic substrate which did not require high pressures.

Another process for forming metallic bonds is described in U.S. Pat. No. 2,857,663 by James E. Beggs. Basically, this method employs an alloying metal, such as a metal from the titanium group, IV$b$, of the Periodic Table, and an alloying metal, such as copper, nickel, molybdenum, platinum, cobalt, chromium or iron. When the alloying metal and a member of the titanium group are placed between non-metallic refractory materials or a non-refractory metallic material and a metallic material and are heated to a temperature at which a eutectic liquidus is formed, a strong bond forms between the adjacent members. While this process has been satisfactory for many applications, the desire to improve the integrity of the bond, increase the thermal conductivity between a metal member and a non-metallic refractory member as well as providing a high current carrying conductor on the non-metallic refractory member has prompted researchers to seek still other methods of bonding.

It is therefore an object of this invention to provide a bond and a method of bonding non-metallic materials together, and metal members to non-metallic members without the use of intermediary bonding layers.

Another object of this invention is to provide a bond and a method of bonding non-metallic refractory materials together or to metal members in a simple heating step without the need for intermediate wetting agents.

Yet another object of this invention is to provide a tenacious bond and a method of forming this bond between a non-metallic refractory material and a metal which is useful in the formation of integrated circuit modules, and to provide high current carrying electrical conductors on insulating members with high thermal conductivity paths to a heat sink and to provide hermetic seals between two non-metallic refractory materials.

It is also an object of this invention to provide a bond for joining together a metallic and a non-metallic member, which bond forms at a temperature below the melting point of the metal, but at a temperature which produces a eutectic with the metal.

Briefly, our invention relates to bonds and methods of bonding together non-metallic members to metallic members. By way of example, a bond between metallic and non-metallic members is formed by placing a metallic member in contact with a non-metallic member preferably exhibiting refractory characteristics and elevating the temperatures of the members in a reactive atmosphere of selected gases and at controlled partial pressures for a sufficient time to produce a eutectic composition which exhibits a eutectic melt. This eutectic melt forms at a temperature below the melting point of the metallic member and wets the metallic member and the non-metallic refractory member so that upon cooling, a tenacious bond is formed between the metallic and non-metallic members. Useful metallic materials include copper, nickel, cobalt and iron, for example. Useful reactive gases include oxygen, phosphorus-bearing compounds and sulfur-bearing compounds, for example. In general, the amount of reactive gas necessary to produce tenacious bonds is dependent, in part, upon the thickness of the metallic and non-metallic members and the times and temperatures required to form the eutectic melt.

Other objects and advantages of our invention will become more apparent to those skilled in the art from the following detailed description taken in conjunction with the accompanying drawings in which:

FIG. 1 illustrates a typical bond between non-metallic and metallic materials in accord with our invention;

FIG. 2 is a series of schematic illustrations in the process of making a metal to non-metal bond in accord with one embodiment of our invention;

FIG. 3 is a flow diagram illustrating the process steps in accord with the embodiment of FIG. 2;

Figure 7:
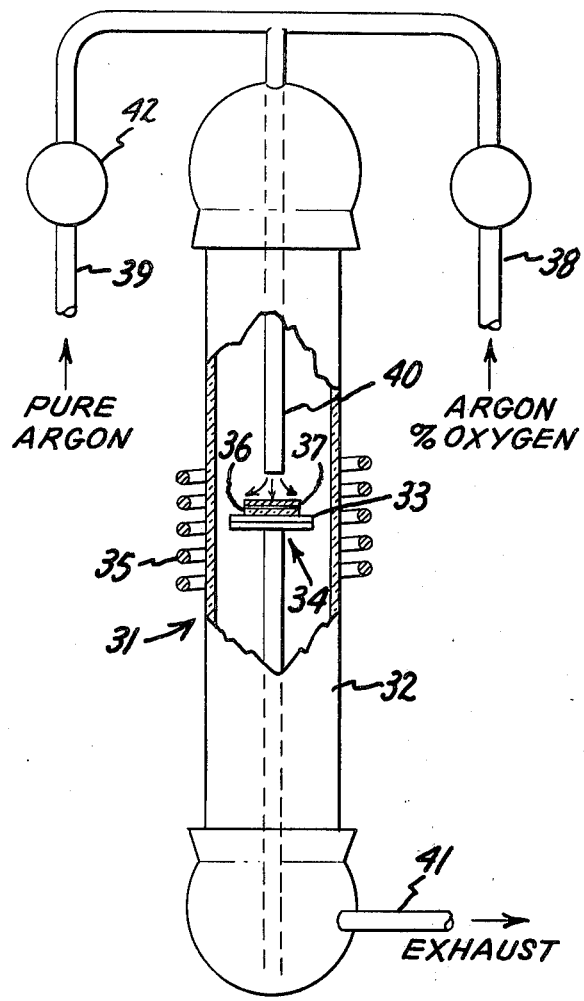
Figure 6:
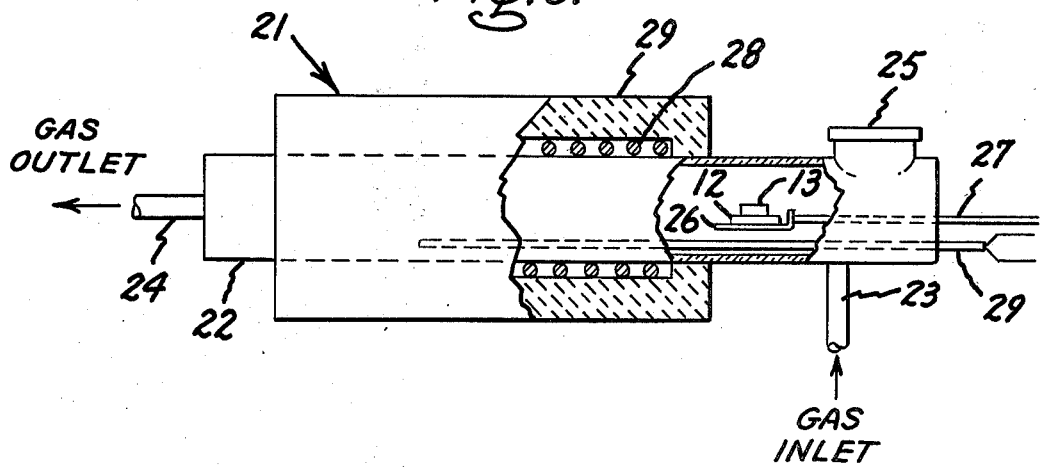

FIG. 6 schematically illustrates a horizontal furnace useful in practising our invention; and FIG. 7 schematically illustrates a vertical furnace useful in practising our invention.

FIG. 1 illustrates, by way of example, a typical bond 11 between a non-metallic refractory member 12 and a metallic member 13. The bond 11 comprises a eutectic composition formed with the metallic member and a reactive gas in accord with the novel aspects of our invention.

As used herein, the term non-metallic material is intended to include refractory materials such as alumina (Al$_2$O$_3$), beryllia (BeO), fused silica or other useful materials, such as titanates and spinnels, for example. Alumina and beryllia are particularly useful in the practice of our invention since they exhibit a high thermal conductivity which makes them particularly useful for semiconductor integrated circuit applications or in high power electrical circuits. However, other non-metallic refractory materials may also be employed, if desired, and our invention is not limited solely to these materials.

The metallic member 13 may include such materials as copper, iron, nickel, cobalt, chromium and silver, for example. Also, alloys of these materials, such as copper-nickel, nickel-cobalt, copper-chromium, copper-cobalt, iron-nickel, silver-gold, and ternary compositions of iron, nickel and cobalt, are useful in practising our invention. As will become more apparent from the following description, still other metallic materials, such as beryllium-copper, for example, may also be advantageously employed, if desired.

The novel process for making a tenacious bond between the metallic member 13 and a substrate 12 such as a non-metallic refractory material 12 is illustrated schematically in FIG. 2 and in the flow chart of FIG. 3. More specifically, FIG. 2 illustrates a non-metallic refractory material 12, such as alumina or beryllia, for example, with a metallic member 13 overlying the non-metallic refractory substrate 12. The substrate 12 and the metallic member 13 are placed in a suitable oven or furnace including a reactive atmosphere which at an elevated temperature forms a eutectic composition 11 on the surfaces of the metallic member 13. The term eutectic or eutectic composition means a mixture of atoms of the metallic member and the reactive gas or compound formed between the metal and the reactive gas. For example, where the metallic member is copper and the reactive gas is oxygen, the eutectic is a mixture of copper and copper oxide. Where the metal is nickel and the reactive gas is phosphorus, the eutectic is a mixture of nickel and nickel phosphide. Still further, where the metallic member is cobalt and the reactive gas is a sulfur-bearing gas, the eutectic is formed between cobalt and cobalt sulfide.

Table I is a representative listing of still other eutectics which are useful in practising our invention. These eutectics are formed by reacting the metallic member to be bonded with a reactive gas controllably introduced into the oven or furnace.

TABLE I

| Metal-Gas Eutectic | Eutectic Temp., °C. | Per Cent by Weight of reactive Gas at Eutectic Temp. | |
| --- | --- | --- | --- |
| Iron-Oxygen | 1523° | 0.16 | O₂ |
| Copper-Oxygen | 1065° | 0.39 | O₂ |
| Chromium-Oxygen | 1800° | 0.6 | O₂ |
| Chromium-Sulfur | 1550° | 2.2 | S |
| Copper-Phosphorus | 714° | 8.4 | P |
| Nickel-Oxygen | 1438° | 0.24 | O₂ |
| Nickel-Phosphorus | 880° | 11.0 | P |
| Molybdenum-Silicon | 2070° | 5.5 | Si |
| Silver-Sulfur | 906° | 1.8 | S |
| Silver-Phosphorus | 878° | 1.0 | P |
| Copper-Sulfur | 1067° | 0.77 | S |
| Cobalt-Oxygen | 1451° | 0.23 | O₂ |
| Aluminum-Silicon | 577° | 11.7 | Si |

Tenacious bonds are formed in accord with our invention by increasing the temperature of the metallic and non-metallic members until the eutectic composition forms. This eutectic composition wets the adjoining non-metallic and metallic members so that upon cooling, the metallic and non-metallic members become tenaciously bonded together. Where alloys are employed as the metallic member, the eutectic composition is believed to form with one of the elemental metals, generally the one with the lower melting point.

One factor which appears to affect the tenacity and uniformity of the bond is the relationship between the melting point of the metallic member and the eutectic temperature. Where the eutectic temperature is within approximately 30° to 50° C. of the melting point of the metallic member, for example, the metallic member tends to plastically conform to the shape of the substrate member and thereby produce better bonds than those eutectics which become liquidus at temperatures greater than approximately 50° C. below the melting point of the metallic member. The uniformity of the bond therefore appears to be related to the "creep" of the metal which becomes considerable only near the melting point. From Table I, for example, it can be seen that the following eutectic compounds meet this requirement: copper-copper oxide, nickel-nickel oxide, cobalt-cobalt oxide, iron-iron oxide and copper-copper sulfide.

Figure 4:
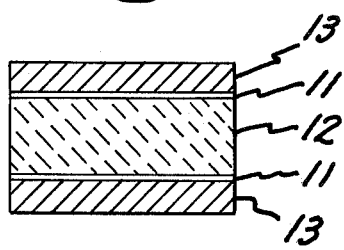
FIGS. 4 and 5 illustrate still other bonds made in accord with our invention.

FIG. 4 illustrates an alternative embodiment of our invention wherein a non-metallic refractory material 12 has two metallic members 13 bonded to opposite surfaces thereof by bonds 11.

Figure 5:
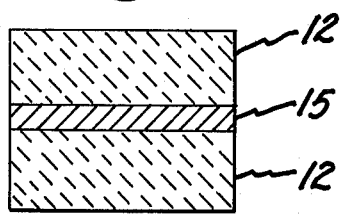

FIG. 5 illustrates still another embodiment of our invention wherein two non-metallic members 12, such as alumina a beryllia, for example, are bonded together by a metallic member 15. In this embodiment of our invention the eutectic forms in substantially the same manner as described above but for the fact that bonding occurs on both surfaces of the metallic member 15. This embodiment of our invention is particularly useful in forming hermetic seals between non-metallic refractory materials, for example, such as those employed in the fabrication of vacuum tubes, such as high frequency type tubes.

Having thus described some useful embodiments of our invention and the overall method of forming metal-to-non-metal and non-metal-to-non-metal bonds, apparatus useful in practising our invention along with more specific details of the process will now be described with reference to FIG. 6. More specifically, FIG. 6 illustrates a horizontal furnace comprising an elongated quartz tube 22, for having a gas inlet 23 at one end thereof and a gas outlet 24 at the other end. The quartz tube 22 also includes an opening or port 25 through which materials are placed into and removed from the furnace. The materials are placed on a holder 26 having a push rod 27 extending through one end of the furnace so that the holder and materials placed thereon may be introduced and removed from the furnace.

The furnace 21 is also provided with suitable heating elements, illustrated in FIG. 6 as electrical wires 28 which surround the quartz tube 22 in the region to be heated. The electrical wires 28 may, for example, be connected to a suitable current source, such as a 220-volt alternating current source. The electrical wires 28 may then be surrounded by suitable insulating material 29 to confine the heat generated by the electrical wires to the region within the quartz tube. Obviously, those skilled in the art can readily appreciate that other heating means may also be employed, if desired, and that FIG. 6 is merely illustrative of one such heating means. The temperature of the furnace is detected by a suitable thermocouple 29 which extends through an opening in the quartz tube so that electrical connections can be made thereto.

FIG. 6 also illustrates a substrate 12 such as a non-metallic refractory material positioned on the holder 26 and a metallic material 13 overlying the substrate 12. These materials are introduced into the quartz tube through the opening 25 which is then sealed by suitable stopper means.

The quartz tube 22 is then purged with a reactive gas flow of approximately 4 cubic feet per hour, for example. As used herein reactive gas flow or atmosphere means a mixture of an inert gas such as argon, helium or nitrogen, for example, with a controlled minor amount of a reactive gas, such as oxygen, a phosphorus-containing gas such as phosphine, for example, or a sulfur-containing gas such as hydrogen sulfide, for example. The amount of reactive gas in the total gas flow is dependent, in part, on the materials to be bonded and the thickness of the materials, in a manner more fully described below. In general, however, the partial pressure of the reactive gas must exceed the equilibrium partial pressure of the reactive gas in the metal at or above the eutectic temperature. For example, when bonding copper members to refractory members in a reactive atmosphere including oxygen, the partial pressure of oxygen must be above $1.5 \times 10^{-6}$ atmosphere at the eutectic temperature of 1065° C.

After purging the quartz tube, the furnace is then brought to a temperature sufficient to form a eutectic liquidus or melt at the metal-substrate interface. For example, for a copper-alumina bond with oxygen as the reactive gas, the temperature of the furnace is brought to between approximately 1065° and 1075° C. Within this range of temperatures, a copper-copper oxide eutectic forms on the copper member 13. This eutectic melt then wets the copper and the alumina to form a tenacious bond therebetween.

In general, the times necessary to form this eutectic melt range between approximately 10 minutes for 1-mil-thick copper members and approximately 60 minutes for 250-mil-thick copper members. A more detailed relationship between cooper thickness and time at an elevated temperature of between 1065° and 1075° C. is presented below in Table II for a reactive atmosphere including oxygen.

TABLE II

| COPPER THICKNESS, Mils | SUBSTRATE THICKNESS, Mils | TIME AT ELEVATED TEMPERATURE, Minutes |
| --- | --- | --- |
| 1 | 25 Mil, 96% Alumina | 10 |
| 2 | 25 Mil, 96% Alumina | 15 |
| 5 | 25 Mil, 99% Alumina | 15 |
| 5 | 25 Mil, 99% Beryllia | 15 |
| 10 | 25 Mil, 96% Alumina | 30 |
| 20 | 25 Mil, 96% Alumina | 45 |
| 5 | 150 Mil, 99% Alumina | 30 |
| 250 | 25 Mil, 96% Alumina | 60 |

Table II illustrates the relationship between copper thickness, non-metallic refractory material thickness and firing time in the furnace, i.e., the time at which the metal-non-metal materials remain in the furnace. From this table it is readily apparent that the firing time increases with the metal thickness, although there does not appear to be a linear relationship between the two.

By way of further example, the formation of metallic bonds to non-metallic refractory materials in accord with our invention may also be achieved by employing a vertical-type furnace, such as that illustrated in FIG. 7. More specifically, FIG. 7 illustrates a vertical furnace 31 including a vertically positioned quartz tube 32, for example, with a carbon susceptor 33 positioned on a fused silica pedestal 34. The quartz tube 32 is surrounded with R.F. heating coils 35 which are powered by an external R.F. generator, not shown.

FIG. 7 also illustrates a substrate 36 such as a non-metallic refractory material resting on the susceptor 33 with a metal member 37 placed thereover. Inert and oxidizing gases are introduced through inlets 38 and 39, respectively. The combined gas flows pass through conduit 40 onto the metallic and non-metallic members and exhaust through an exhaust outlet 41. Flow meters 42 and 43 on each inlet monitor and control the rate of flow of the gases into the furnace.

By way of example, the operation of the vertical furnace will be described with reference to the formation of a bond between a 5-mil-thick copper member and an approximately 70-mil-thick beryllia member. The flow meters 42 and 43 are adjusted so that pure argon is introduced at inlet 38 and argon containing 2 percent oxygen is introduced at inlet 39. The quartz tube is then flushed or purged for approximately 10 minutes with a flow rate of approximately 2 cubic feet per hour of argon and approximately 1 cubic foot per hour of the argon-containing oxygen gas produces a total oxygen content in the combined gases of approximately 0.04 molar percent.

During the purging time, the temperature of the susceptor, beryllia and copper members is maintained at room temperature. After the purging period, the R.F. power is applied until the temperature of the copper member exceeds 1065° C., but is below 1083° C. Typically, 2 to 5 minutes are required to produce this temperature which may, for example, be monitored optically. Optical monitoring of temperature is well known in the art and as the copper member heats up from room temperature, a red-brown oxidation color typical of copper oxide appears on the surface. Above 600° C., the copper surface emits light strongly. At a temperature of 1065° C., a liquid layer is observed around the copper member. The liquid layer wets both the beryllia and copper members as evidenced by a drastic color change. Wetting first occurs at the outer edges of the copper member where a black color appears which then moves toward the center of the copper, until the entire copper member appears black to the eye. Under these conditions, the copper member retains its structural integrity and does not break up into separate liquid droplets. When the wetting process is completed over the entire surface area, the R.F. power is removed and the members permitted to cool. Upon removal of the copper and beryllia from the furnace, the copper is strongly bonded to the beryllia and bond strengths in excess of 20,000 pounds per square inch have been observed.

The shape of the bonded copper member is substantially the same as that of the original unbonded copper. However, there is some evidence of oxidation and precipitation of copper oxide in the bonded member. Also, some recrystallization of the grain structure within the copper member is discernible.

Without limiting our invention to any particular theory of operation, it is believed that the tenacious bonds formed in accord with our invention result from the reaction of the metal with the resulting gas during the heating period prior to the formation of the eutectic melt. During this period, a small amount of the reacting gas dissolves into the metal, but most of it reacts with the metal to form a eutectic with the metal over its exposed surfaces. At the eutectic temperature, 1065° C. for cooper-copper oxide, for example, a liquid phase of or near the eutectic composition forms a "skin" around the metal. The thickness of this molten skin depends upon the partial pressure of the reacting gas and the length of time at the elevated temperature. For example, for copper-oxygen systems, a partial pressure of oxygen less than $1.5 \times 10^{-6}$ atmosphere (the equilibrium partial pressure over $Cu_2O$ at 1065° C.), the copper-oxygen eutectic will not form. Hence, partial pressures in excess of this value are required to produce the desired eutectic.

Under conditions permitting the formation of the eutectic, the eutectic appears to wet the metal and the non-metallic refractory material in such a way that upon cooling, a strong bond forms between the two materials. A strong bond has also been observed between pure copper at its melting point of 1083° C., in the absence of a reacting gas (or even in a reducing atmosphere), however, the copper member loses its structural integrity and forms liquid droplets which are bonded to the non-metallic refractory material.

If the partial pressure of the reacting gas is too high, all the metal reacts with the reactive gas and forms, for example, an oxide, sulfide, phosphide, etc., which prevents the formation of the eutectic melt. Thus, an intermediate reacting gas partial pressure is required so that both the eutectic melt phase and the metallic phase are present simultaneously. Tests have illustrated that extremely strong bonds are achieved when both phases are present. Accordingly, in practising our invention the partial pressure of the reacting gas must be sufficiently great to permit the formation of a eutectic with the metal but not so great as to completely convert the metal to the oxide, sulfide, phosphide, etc. during the bonding time.

More specifically, we have found that consistently good bonds are achieved between metals and non-metallic materials, such as copper and alumina or beryllia, for example, in the presence of oxygen, so long as the percentage of oxygen in the inert gas ranges between approximately 0.03 and 0.1 percent by volume. No bonding occurred where the percentage of oxygen was less than approximately 0.01 percent by volume because there was insufficient oxide formation. Also, no bonding occurred where the percentage of oxygen was above 0.5 percent of the total gas flow because of complete oxidation of the metal. In the intermediate regions, i.e., 0.01 to 0.03 and 0.1 to 0.5, marginal bonding occurs. Accordingly, to produce consistently good bonds between copper and alumina or beryllia, operation is preferable within the range of approximately 0.03 and 0.1 percent by volume.

Table III illustrates ranges for partial pressures of the reactive gases at which good bonding occurs for other metals and gases. Only those eutectics which exhibit a eutectic temperature within 50° C. of the melting point of the metal are listed.

TABLE III

| EUTECTIC COMPOUND | % REACTIVE GAS BY VOLUME |
| --- | --- |
| Cu — CuO | 0.01 – 0.5 |
| Cu — CuS | 0.01 – 0.5 |
| Ni — NiO | 0.01 – 0.3 |
| Co — CoO | 0.01 – 0.4 |
| Fe — FeO | 0.01 – 0.3 |

It is to be understood that these selected metals, non-metals and reactive gases are given merely by way of illustration and not limitation. Further examples of suitable materials and reactive gases will occur to those skilled in the art.

For example, useful bonds are formed with the aforementioned binary metallic composition such as copper-nickel, nickel-cobalt, copper-chromium, copper-cobalt, iron-nickel and beryllium-copper in a reactive atmosphere including oxygen. Ternary compositions of iron, nickel and cobalt also form useful bonds in a reactive atmosphere of oxygen. Also, silver-gold compositions bond to non-metallic refractory members in a reactive atmosphere including a sulfur-bearing gas such as hydrogen sulfide, for example.

Those skilled in the art can also readily appreciate that metallic members bonded to a non-metallic refractory material may be patterned by photolithographic masking and etching techniques to produce a desired pattern in the metallic member after forming the desired bond. This method of forming patterned conductors is preferable in the fabrication of semiconductor integrated circuits, for example, where the size of the conductors if preformed before bonding would pose serious handling problems.

Microwave tests performed on electrical circuits formed by patterning copper bonded to alumina exhibit Q's comparable to those formed by thin film techniques. For example, Q's in excess of 450 have been observed.

While particular embodiments of the invention have been described, it will be obvious to those skilled in the art that various changes and modifications may be made thereto without departing from the invention in its broader aspects. For example, the total gas flow rate may be varied over wide limits without materially affecting the bond and economic considerations will generally control the acceptable gas flow rate. Further, the partial pressure of the reactive gas in the inert gas also can be varied depending in part on the relative sizes of the materials to be bonded, the gas flow rate, the presence of reactive elements in the flow system, such as carbon susceptors, in the case of an oxygen system, the warm-up rafte prior to bonding and the presence of residual oxygen or water in the bonding system and the bonding time. Therefore, it is intended that the appended claims cover all such changes and modifications as fall within the true spirit and scope of our invention.

What we claim as new and desire to secure by Letters Patent of the United States is:

1. A bonded structure comprising:
    a metallic member constituting a metallic substance selected from the group consisting of copper, nickel, cobalt, iron, chromium, copper-nickel, nickel-cobalt, copper-chromium, copper-cobalt, iron-nickel, silver-gold and beryllium-copper;

a non-metallic member selected from the group consisting of alumina, beryllia, and fused silica;

and a bond between said metallic member and said non-metallic member comprising a fused eutectic composition comprising a mixture of said metallic substance and a reactive gas selected from the group consisting of a sulfur-bearing gas and a phosphorus-bearing gas, said mixture being substantially devoid of oxides of said metallic substance.

2. The structure of claim 1, in which:
said eutectic mixture comprises a compound of said metallic substance and said reactive gas.

3. The structure of claim 1, in which:
said eutectic mixture further comprises free molecules of said reactive gas entrapped within said mixture.

4. The structure of claim 1, in which:
said metallic member has a thickness of between approximately 1 and 250 mulli-inches.

5. A bonded structure comprising:
a metallic member comprised of copper;
a non-metallic member comprised of beryllium; and
a bond between said metallic member and said non-metallic member comprising a fused eutectic composition comprising a mixture of said copper and a reactive gas selected from the group consisting of oxygen, a sulfur-bearing gas, and a phosphorous-bearing gas.

6. A bonded structure comprising:
a metallic member constituting a metallic substance selected from the group consisting of nickel, cobalt, iron, chromium, nickel-cobalt, iron-nickel and silver-gold;
a non-metallic member selected from the group consisting of alumina, beryllia, and fused silica; and
a bond between said metallic member and said non-metallic member comprising a fused eutectic composition comprising a mixture of said metallic substance and an active gas selected from the group consisting of oxygen, a sulphur-bearing gas, and a phosphorous-bearing gas.

* * * * *